(12) United States Patent  (10) Patent No.: US 6,717,229 B2
Buchanan et al.  (45) Date of Patent: Apr. 6, 2004

(54) DISTRIBUTED REVERSE SURGE GUARD

(75) Inventors: Walter R. Buchanan, Olathe, KS (US);
Roman J. Hamerski, Olathe, KS (US);
Wayne A. Smith, Liberty, MO (US)

(73) Assignee: Fabtech, Inc., Lee's Summit, MO (US)

( * ) Notice: Subject to any disclaimer, the term of this patent is extended or adjusted under 35 U.S.C. 154(b) by 45 days.

(21) Appl. No.: 10/096,203

(22) Filed: Mar. 11, 2002

(65) Prior Publication Data

US 2002/0105044 A1 Aug. 8, 2002

Related U.S. Application Data

(63) Continuation-in-part of application No. 09/945,147, filed on Aug. 31, 2001, now abandoned, which is a continuation of application No. 09/487,022, filed on Jan. 19, 2000, now abandoned.

(51) Int. Cl.[7] .............................................. H01L 27/095
(52) U.S. Cl. ...................... 257/475; 257/476; 257/483; 257/484; 257/551; 257/605
(58) Field of Search .................. 257/471, 475, 257/476, 483, 484, 199, 481, 551, 603, 605

(56) References Cited

U.S. PATENT DOCUMENTS

| | | | |
|---|---|---|---|
| H40 H | 4/1986 | Buchanan, Jr. et al. |
| 4,646,115 A | 2/1987 | Shannon et al. |
| 4,862,229 A | 8/1989 | Mundy et al. |
| 4,901,120 A | 2/1990 | Weaver et al. |
| 5,017,976 A | 5/1991 | Sugita |
| 5,060,037 A | 10/1991 | Rountree |
| 5,081,509 A | 1/1992 | Kozaka et al. |
| 5,130,760 A | 7/1992 | Martzen et al. |
| 5,138,403 A | 8/1992 | Spitzer |
| 5,148,241 A | 9/1992 | Sugita |
| 5,233,209 A | 8/1993 | Rodgers et al. |
| 5,278,443 A | 1/1994 | Mori et al. |
| 5,291,051 A | 3/1994 | Hoany et al. |
| 5,345,100 A | 9/1994 | Kan et al. |
| 5,371,400 A | 12/1994 | Sakurai |
| 5,430,311 A | 7/1995 | Murakzmi et al. |
| 5,536,958 A | 7/1996 | Shen et al. |
| 5,561,313 A | 10/1996 | Saitch et al. |
| 5,691,554 A | 11/1997 | Matthews |
| 5,850,095 A | 12/1998 | Chen et al. |
| 5,914,500 A | 6/1999 | Bakowski et al. |
| 5,923,079 A | 7/1999 | Narita |
| 6,011,280 A | 1/2000 | Fruth et al. |

FOREIGN PATENT DOCUMENTS

| | | |
|---|---|---|
| DE | 197 23 176 C | 8/1998 |
| DE | 19824514 | 12/1998 |
| EP | 0372428 | 6/1990 |
| JP | 04 233281 A | 8/1992 |
| JP | 05 326925 A | 12/1993 |
| JP | 10 116999 A | 5/1998 |

*Primary Examiner*—George Eckert
(74) *Attorney, Agent, or Firm*—Kyle L. Elliott; Blackwell Sanders Peper Martin LLP

(57) ABSTRACT

A diode (20), having first and second conductive layers (24,26), a conductive pad (28), and a distributed reverse surge guard (22), provides increased protection from reverse current surges. The surge guard (22) includes an outer loop (42) of $P^+$-type surge guard material and an inner grid (44) of linear sections (46, 48) which form a plurality of inner loops extending inside the outer loop (42). The surge guard (22) distributes any reverse current over the area of the conductive pad (28) to provide increased protection from transient threats such as electrostatic discharge (ESD) and during electrical testing.

20 Claims, 1 Drawing Sheet

DISTRIBUTED REVERSE SURGE GUARD

RELATED APPLICATIONS

This is a continuation-in-part of U.S. patent application Ser. No. 09/945,147, filed Aug. 31, 2001, abandoned which is a continuation of U.S. patent application Ser. No. 09/487,022 filed Jan. 19, 2000 abandoned.

COPYRIGHT NOTICE AND AUTHORIZATION

A portion of the disclosure of this patent document contains material, which is subject to mask work protection. The mask work owner has no objection to the facsimile reproduction by anyone of the patent document or the patent disclosure, as it appears in the Patent and Trademark Office patent file or records, but otherwise reserves all mask work rights whatsoever.

FIELD OF THE INVENTION

This invention relates to electrical components and, more particularly, to semiconductor devices, such as Schottky diodes, which include surge guard protection material to inhibit damage from electrostatic discharge.

BACKGROUND OF THE INVENTION

The use of hand held and desktop electronic devices, such as computers and mobile telephones, has increased tremendously in recent years, and the demand for these devices continues to increase at an overwhelming rate. These devices by nature are generally portable or easily accessible and are frequently in direct contact with users. Further, they are exposed to dust and may be carried outside the office increasing their exposure to the elements. This operational environment presents a risk of damage to the electrical components of these devices from transient threats such as electrostatic discharge (ESD) and lightning.

In Schottky diodes, two layers of preferably N-type conductive material are provided with a rectifying barrier metal. The two layers include an epitaxial layer grown on a highly doped, single crystal semiconductor substrate layer. The rectifying metal is deposited on the epitaxial layer to form a semiconductor junction which provides the rectifying property of conducting current in one direction when the barrier metal is under positive bias and blocking current flow when the barrier metal is under the opposite bias. In the case of Schottky power rectifiers, the dominant type of current across the barrier is the thermionic emission current.

In a subsequent processing step, a back, metal contact is formed on the $N^+$ substrate layer side of the diode. The function of the metal contact is to conduct current with minimal resistance in either direction, that is, under any bias applied to the diode. This is primarily achieved by the high doping level of the $N^+$-type substrate, which makes field emission or tunneling a prevalent mechanism of the current flow through the metal contact.

To achieve acceptable reverse bias blocking characteristics and protect the diodes from transient threats, various methods have been developed for termination of the periphery of the barrier metal. In one common method of inhibiting damage from ESD, lightening, load switching and other transient threats, a perimeter ring of $P^+$-type material is diffused into the "top" $N^-$-type conductive layer around the perimeter termination of the barrier metal. The $P^+$-type ring minimizes reverse current leakage and provides a reverse current path for reverse current surge to protect the barrier metal and N-type conductive layers from exposure to critical electrical fields generated by transient threats and during electrical testing. That is, the avalanche breakdown voltage is lowest at the P/N junction formed by the P-type ring, so that when ESD occurs sufficient to exceed the avalanche breakdown voltage at the P/N junction, the P-type ring directs the reverse flow of current through the P/N junction and away from the central area of the barrier metal.

The protection provided by the P-type ring is effective until the reverse voltage drop across the P/N junction rises to the breakdown voltage of the Schottky diode or the reverse current causes localized heating of the barrier metal adjacent the P-type ring; it is not definitively known which affect is controlling. When the reverse current reaches a sufficiently high level, the barrier metal and "top" N-type layer are melted rendering the diode inoperable for its intended function. To increase the effectiveness of the P-type guard ring, a variety of guard ring features are optimized to find the best combination of features and enhance reverse surge capability. For example, the width and/or the depth of the ring can be increased, the concentration of dopant in the ring can be increased, and/or the thickness and resistivity of the "top" N-type layer can be reduced. While optimization of these features achieves incremental improvements in reverse surge capability, continuous progress in the electronics area and higher consumer expectations of product reliability and performance have prompted higher reverse surge performance standards, which are nearly beyond the incremental improvements previously achieved. Further, modifying the diode in these ways can undesirably degrade the operational parameters of the diode.

BRIEF SUMMARY OF THE INVENTION

There is, therefore, provided in the practice of the invention a novel electrical component with a distributed reverse surge guard, which increases protection from reverse current surges without degrading operational parameters of the electrical component. The electrical component broadly includes a conductive pad with a primary conductive area edge. A first region of surge guard material is positioned adjacent the primary conductive area perimeter edge, and a second region of surge guard material is positioned adjacent the conductive pad and spaced from the primary conductive area edge.

In a preferred embodiment, the second region has first and second sides, which are positioned within the primary conductive area edge. Preferably, the first region is a substantially continuous perimeter loop of $P^+$-type material, and the second region is a grid of perpendicular $P^+$-type material lines extending between opposite sides of the perimeter loop. The grid forms a plurality of substantially rectangular, preferably square, inner loops of substantially the same size extending within the perimeter loop, and some of the inner loops overlap in part with the perimeter loop.

It is further contemplated in the practice of the invention, that the distributed reverse surge guard is used in a diode having first and second conductive layers with conductive types and with the conductive pad in electrical communication with one of the conductive layers. At least a single region of surge guard material including a first side and a second side is positioned adjacent the conductive pad with each of the first and second sides within the perimeter of the primary conductive area of the conductive pad.

It is still further contemplated in the practice of the invention that the diode is constructed by forming a monocrystalline substrate layer of semiconductor material having a first conductive type and depositing an epitaxial layer on the substrate. The epitaxial layer having a second conductive type. A first region of surge guard material is formed on an outer surface of a selected one of the substrate layer and the epitaxial layer, and the first region has extremities and an opposite conductive type. A second region of surge guard material is also formed on the outer surface of the selected layer. The second region is also of the opposite conductive type and is positioned within the extremities of the first region. A conductive pad is also placed over the outer surface of the selected layer In a preferred embodiment, the conductive pad on the outer surface of the selected layer, covers at least a portion of the second region and is deposited on the outer surface after the first and second regions are formed by diffusing a P-type dopant into the epitaxial layer. Preferably, the conductive pad covers all of the second region and at least part of the first region. In constructing the diode the first and second regions are formed substantially simultaneously, and the conductive pad is deposited after the first and second regions are formed.

Accordingly, it is an object of the present invention to provide an improved electrical component with a distributed reverse surge guard providing increased protection from ESD and other transient threats.

It is a further object of the present invention to provide an improved method of constructing an electrical component with a distributed reverse surge guard providing increased protection from ESD and other transient threats.

BRIEF DESCRIPTION OF THE DRAWINGS

These and other inventive features, advantages, and objects will appear from the following Detailed Description when considered in connection with the accompanying drawings in which similar reference characters denote similar elements throughout the several views and wherein.

For the purpose of clarity in illustrating the characteristics of the present invention, accurate proportional relationships of the elements have not been maintained in the Figures. Instead, the sizes of certain small components have been exaggerated.

DETAILED DESCRIPTION

Figure 1:
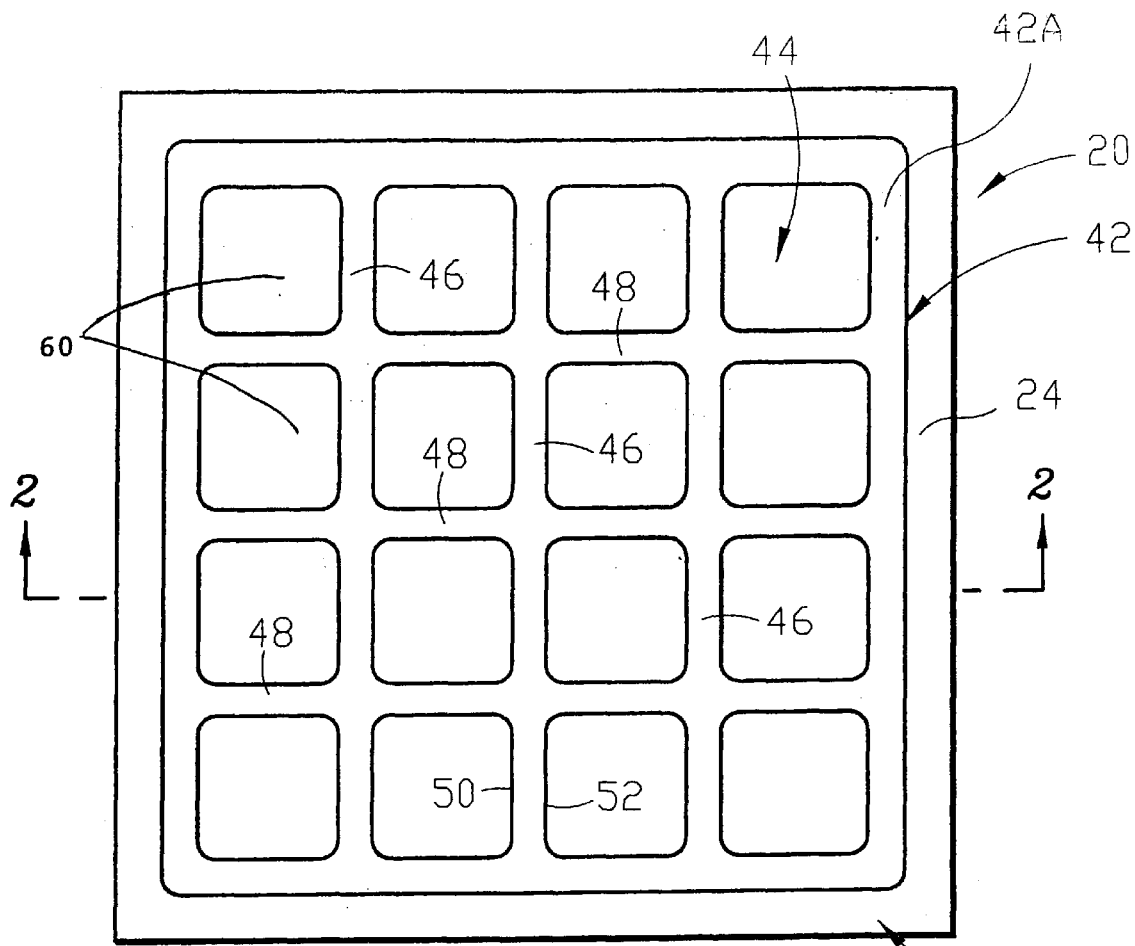
FIG. 1 is an enlarged, schematic top view of a diode with a top layer removed for illustration and having a distributed reverse surge guard according to the present invention.
Figure 2:
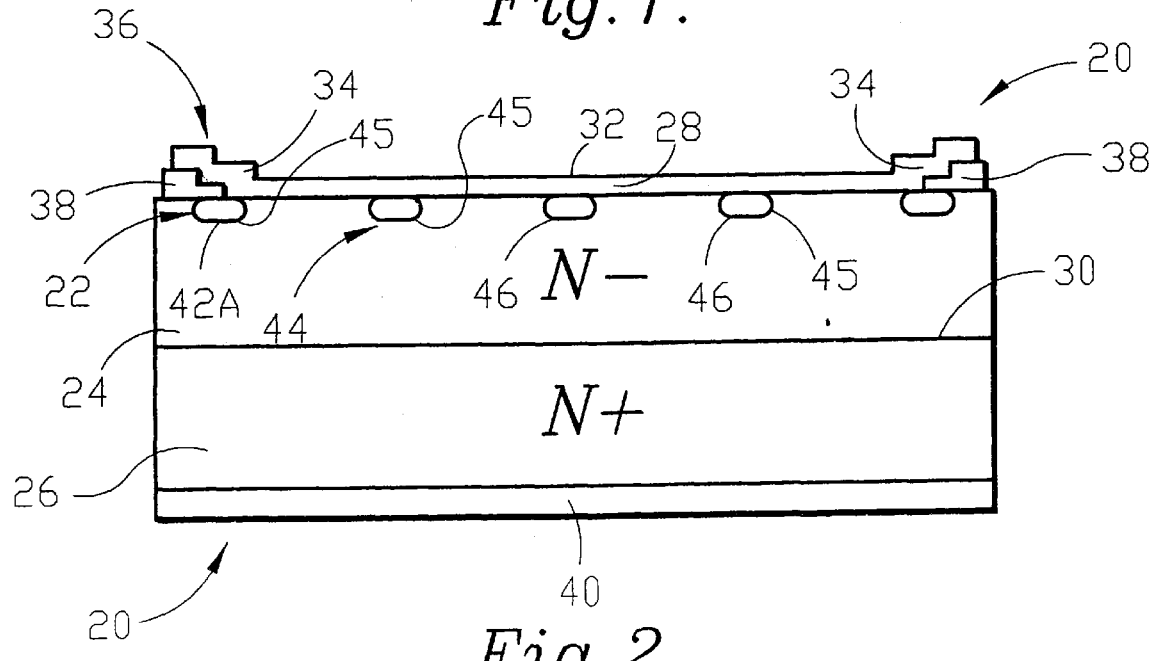
FIG. 2 is an enlarged, schematic cross-sectional view of the diode of FIG. 1 taken along line 2—2 in FIG. 1.

Referring to the drawings in greater detail, FIGS. 1 and 2 show a Schottky diode 20 having a distributed surge guard 22 constructed in accordance with a preferred embodiment of the present invention. The diode 20 broadly includes first and second conductive layers 24, 26 and a conductive pad 28. The surge guard 22 is formed in the first conductive layer 24 and operates to protect the conductive pad 28 and conductive layers 24,26 from damage due to transient threats such as electrostatic discharge (ESD) or electrical testing.

The first conductive layer 24 of the diode 20 has a first conductive type, which is preferably $N^-$ type. Thus, the first and second conductive type are actually the same conductive type with the distinction being the dopant concentration. The first layer is formed by depositing an epitaxial layer on the second substrate layer, which is formed by growing a monocrystalline ingot. The substrate layer is heavily doped, so that it has a low resistivity to conducting current. The epitaxial layer has a lower dopant concentration, so that it has a high resistivity. The first layer is preferably formed as an epitaxial layer using the second layer 26 as a substrate. The second layer 26 has a second conductive type, which is preferably $N^+$ type. The second layer is preferably a monocrystalline semiconductor material. The first and second layers are in electrical communication and are preferably juxtaposed and in direct physical contact at an $N^-/N^+$ junction 30. Though N-type material is preferred, P-type material can also be used for the first and second layers. Though the particular dopants used to achieve the conductive layers of the present invention will not be described particularly, it should be understood that boron can be used as a P-type dopant while phosphorous, arsenic, and antimony can be used as N-type dopants for silicon. Similarly, the semiconductor material can be silicon, germanium, or any compound semiconductor material such as gallium arsenide with appropriate changes to the dopant material.

The conductive pad 28 is preferably a rectifying metallic pad in electrical communication with the first conductive layer and opposite the second conductive layer. In the embodiment shown the pad 28 has a centrally located, primary conductive area 32. The primary pad area 32 is in direct physical contact with the first conductive layer to form a Schottky barrier. The primary pad area terminates at primary conductive area edge 34 located at an inner step of the pad. The primary edge 34 extends around the perimeter of the pad 28 and is surrounded by an edge margin 36, which is separated from the first conductive layer 24 by a passivation/dielectric layer, which preferably comprises an oxide layer 38. An electrical contact 40 is juxtaposed the second conductive layer 26 opposite the first layer 24 and the pad 28. The pad 28 can also operate as an electrical contact for the opposite side of the diode 20, but it is preferred that an additional contact material (not shown) is deposited over the pad 28.

The surge guard 22 includes a first, outer region 42 of surge guard material adjacent the primary conductive edge 34 and a second region 44 of surge guard material within the extremities of the first region 42 and spaced from the edge 34. The first and second regions are preferably joined to integrally form the surge guard 22. The surge guard material is formed with a conductive type opposite the first and second layers and preferably comprises a $P^+$-type conductive material. The P-type material is diffused into the outer/exposed surface of the first conductive layer 24, so that the surge guard regions 42, 44 are in electrical communication and direct physical contact with the conductive pad 28 to form an Ohmic contact which conducts current in both directions. In constructing the diode 20, the first and second regions are diffused substantially simultaneously, and thereafter the conductive pad is deposited on the outer surface of the first, epitaxial layer. Once deposited the conductive pad covers the second region and covers at least part of the first region. Thus, the first layer 24 and surge guard 22 make contact at P/N junctions 45. The first region 42 preferably comprises a substantially continuous and closed outer loop 42A of surge guard material. The outer loop 42A extends around the perimeter conductive edge 34, and the edge is generally centrally positioned within the width of the outer loop 42A. That is, the outer loop 42A is positioned, so that it extends beyond and inside of the perimeter edge 34 as best illustrated in FIG. 2.

The second, inner region 44 comprises a grid of intersecting linear sections 46, 48 forming a plurality of substantially continuous inner loops, which extend, at least in part, inside the perimeter loop 42A. The linear sections 46, 48 extend in transverse, preferably perpendicular, directions between opposite sides of the perimeter loop to divide the pad into sixteen (16) Schottky barrier areas 60. The square barrier areas range in size from approximately 300 μm to approximately 3000 μm in width. Other patterns can be used which divide the pad into more or fewer areas. Each of the linear sections 46, 48 has a first side 50 and a second side 52 which are positioned within the primary perimeter edge 34. The linear sections 46, 48 are also preferably equally spaced, so that the inner loops are substantially the same size and preferably square. The linear sections have a width from approximately 5 microns to approximately 100 microns with a more preferred range of approximately 10 microns to approximately 40 microns. At greater processing expense, the minimum width is reduced to approximately one (1) micron. The inner loops adjacent the perimeter loop 42A overlap the perimeter loop in part. In the configuration shown, the inner corner loops overlap along two sides, and the inner side loops overlap along one side. The dimensions of the barrier areas 60 and the linear sections 46, 48 are selected to maintain the total barrier area, so that forward voltage drop is sufficiently low. Thus, these Schottky devices are characterized by relatively low forward voltage drops. Preferably the device has less than approximately 25% (in other embodiments less than approximately 15%) of the total potential Schottky operational area or conductive pad operational area of the device devoted to total operational guard area that is the linear sections 46, 48 and the guard ring/outer loop 42A. In another embodiment, the device has less than approximately 35% of the total potential Schottky operational area devoted to guard area. Because these devices do not contain sufficient P material/guard area to pinch-off reverse current, the Schottky devices are characterized by relatively high leakage current. Pinch-off diodes are characterized by opposite parameters i.e. high forward voltage drop and low leakage current. One exemplary device is square, with a side length 1480 μm and has nine (9) square barrier areas 60 with a width of approximately 390 μm. The linear sections 46, 48 have widths of approximately 35 μm. This device has a reverse blocking capability of 90V, with a forward voltage drop of approximately 900 mV at 3A forward current. The device has a leakage current of approximately 10 μA at a reverse bias of 90V. This device is able to withstand a reverse current surge of at least 30 keV, which is the European standard. More generally, the device has a forward voltage drop of approximately 900 mV for an average current density of 175.6A/cm². Thus, there is less than approximately 900 mV of forward voltage drop when there is less than approximately 180 A/cm². The current density is calculated based on the total operational area; that is the barrier areas plus the total operational guard area. The overall area of the device is 2,190,400 μm². The total barrier area is 1,368,900 μm², the overall guard area is 821,500 μm². However, 80 microns are used for edge termination around the circumference, and the internal corners of the operational area are rounded leaving a total operational area of 1,708,064 μm² with a total operational guard area of 397,500 μm².

In operation, the distributed reverse surge guard 22 according to the present invention distributes the flow of reverse current across the primary conductive area 32 of the conductive pad 28, and thus, it provides superior protection from reverse current surges caused by transient threats such as ESD. The diode 20 incorporating the distributed reverse surge guard 22 satisfies even the rigorous European test standards. In comparison with a conventional outer surge guard ring, the depth of the diffusion of P⁺-type material is substantially the same. Further, the amount of dopant used is not excessively increased because the perimeter loop 42A and linear sections (46,48) are not as wide as the conventional guard ring. Thus, the distributed reverse surge guard 22 provides increased protection without appreciably degrading the operational parameters of the electrical component. It is understood that the depth, dopant concentration, and other features can be adjusted to optimize the diode for specific applications.

Thus, an electrical component is disclosed which utilizes a distributed reverse surge guard to protect the component from reverse current surges. While preferred embodiments and particular applications of this invention have been shown and described, it is apparent to those skilled in the art that many other modifications and applications of this invention are possible without departing from the inventive concepts herein. For example, a cluster of smaller chips each having their own guard ring would achieve a similar benefit. Further, by way of example, in non-power applications, the first and second layers could be replaced by a single layer of lightly doped substrate. In this application, the first and second conductive types would be the same in the meaning of the claims. It is, therefore, to be understood that, within the scope of the appended claims, this invention may be practiced otherwise than as specifically described, and the invention is not to be restricted except in the spirit of the appended claims. Though some of the features of the invention may be claimed in dependency, each feature has merit if used independently.

What is claimed is:

1. An electrical component having a distributed reverse surge guard, the component comprising:

a conductive pad including a primary conductive area having a primary conductive area edge;

a first region of surge guard material positioned adjacent the primary conductive area edge; and a second region of surge guard material including a first side and a second side positioned adjacent the conductive pad and spaced from the primary conductive area edge with each of the first and second sides within the primary conductive area edge wherein a total operational guard area of the first region and the second region is less than approximately 25 percent of an operational conductive pad area, wherein the component has a forward voltage drop of less than approximately 900 mV where current density is approximately 175 A/cm².

2. The electrical component according to claim 1 further comprising a first conductive layer of a first conductive type, the first conductive layer being in electrical communication with the first and second regions and the conductive pad, and a second conductive layer of a second conductive type, the second conductive layer being in electrical communication with the first conductive layer.

3. The electrical component according to claim 2 wherein the first conductive layer comprises an epitaxial layer, and the second conductive layer comprises a substrate layer of monocrystalline semiconductor material.

4. The electrical component according to claim 2 wherein the first conductive type comprises an N⁻ type, the second conductive type comprises an N⁺ type, and the surge guard material comprises a p⁺ conductive type material.

5. The electrical component according to claim 4 wherein the p³⁰ conductive type material is diffused into the N⁻ type material.

6. The electrical component according to claim 1 wherein the conductive pad comprises a metallic pad having an edge margin, and the first region extends beyond the primary conductive area edge.

7. The electrical component according to claim 1 wherein the first region of surge guard material comprises a substantially continuous perimeter loop, and the second region is positioned within the perimeter loop.

8. The electrical component according to claim 7 wherein the second region comprises a grid of surge guard material forming a plurality of inner loops.

9. The electrical component according to claim 7 wherein the second region comprises a substantially linear region extending between substantially opposite sides of the perimeter loop.

10. An electrical component having a distributed reverse surge guard, the component comprising:
 a conductive pad including a primary conductive area and a perimeter edge;
 a first loop of surge guard material in physical contact and electrical communication with the conductive pad; and
 a second loop of surge guard material in physical contact and electrical communication with the conductive pad wherein the component has a forward voltage drop of less than approximately 900 mV where current density is approximately 175 A/cm$^2$.

11. The electrical component according to claim 10 wherein the first and second loops comprise substantially continuous loops.

12. The electrical component according to claim 10 wherein the first loop extends adjacent the perimeter edge, and the second loop extends at least in part within the first loop.

13. The electrical component according to claim 12 further comprising a plurality of additional loops extending within the first loop.

14. The electrical component according to claim 13 wherein the second loop and the additional loops are substantially rectangular and substantially the same size.

15. The electrical component according to claim 10 wherein the first and second loops overlap in part.

16. A diode having a distributed reverse surge guard, the diode comprising:
 a first conductive layer of a first conductive type;
 a second conductive layer of a second conductive type, the second conductive layer being in electrical communication with the first conductive layer;
 a conductive pad including a primary conductive area having a primary conductive area edge, the primary conductive area being in electrical communication with the first conductive layer;
 a region of surge guard material including a first side and a second side positioned adjacent the conductive pad and spaced from the primary conductive area edge with each of the first and second sides within the primary conductive area edge wherein an operational area of the surge guard material is less than approximately 25 percent of an operational conductive pad area, wherein the component has a forward voltage drop of less than approximately 900 mV where current density is approximately 175 A/cm$^2$; and
 an electrical contact in electrical communication with the second conductive layer.

17. The diode according to claim 16 wherein the first conductive layer is juxtaposed the second conductive layer, the conductive pad is juxtaposed the first conductive layer, and the electrical contact is juxtaposed the second conductive layer.

18. The diode according to claim 16 wherein the first conductive type comprises an N$^-$ type, the second conductive type comprises an N$^+$ type, and the surge guard material comprises a P$^+$ conductive type material.

19. The diode according to claim 16 further comprising another region of surge guard material positioned adjacent the primary conductive area edge, and the first region being in electrical communication with the first conductive layer and the primary conductive area.

20. The diode according to claim 19 wherein the region is joined with the other region.

* * * * *